United States Patent
Petroski

(10) Patent No.: US 8,773,856 B2
(45) Date of Patent: Jul. 8, 2014

(54) METHOD OF MAKING AN ELECTRONIC DEVICE

(75) Inventor: James T. Petroski, Parma, OH (US)

(73) Assignee: GrafTech International Holdings Inc., Parma, OH (US)

(*) Notice: Subject to any disclaimer, the term of this patent is extended or adjusted under 35 U.S.C. 154(b) by 333 days.

(21) Appl. No.: 13/290,382

(22) Filed: Nov. 7, 2011

(65) Prior Publication Data

US 2012/0113595 A1    May 10, 2012

Related U.S. Application Data

(60) Provisional application No. 61/410,993, filed on Nov. 8, 2010.

(51) Int. Cl.
| | | |
|---|---|---|
| *H05K 7/20* | (2006.01) | |
| *B32B 37/12* | (2006.01) | |
| *H05K 1/18* | (2006.01) | |
| *H05K 1/02* | (2006.01) | |

(52) U.S. Cl.
CPC ............ *B32B 37/12* (2013.01); *H05K 1/0201* (2013.01); *H05K 1/0271* (2013.01); *B32B 2309/105* (2013.01); *H05K 1/181* (2013.01); *B32B 2313/04* (2013.01); *B32B 2457/206* (2013.01)
USPC .......................................... 361/705; 361/708

(58) Field of Classification Search
CPC .... H01L 23/373; H05K 7/20963; F28F 21/02
USPC ......... 361/688, 696, 701, 702, 704, 705, 708, 361/717–722
See application file for complete search history.

(56) References Cited

U.S. PATENT DOCUMENTS

| | | | | |
|---|---|---|---|---|
| 5,831,374 | A | * | 11/1998 | Morita et al. .................. 313/46 |
| 6,131,651 | A | * | 10/2000 | Richey, III ..................... 165/185 |
| 6,245,400 | B1 | * | 6/2001 | Tzeng et al. .................. 428/40.1 |
| 6,482,520 | B1 | * | 11/2002 | Tzeng ............................ 428/408 |
| 6,538,380 | B1 | * | 3/2003 | Kanagu et al. ................. 313/582 |
| 6,746,768 | B2 | * | 6/2004 | Greinke et al. ................ 428/408 |
| 7,306,847 | B2 | * | 12/2007 | Capp et al. ..................... 428/408 |
| 7,423,864 | B2 | * | 9/2008 | Kim et al. ................... 361/679.27 |
| 7,486,517 | B2 | * | 2/2009 | Aapro et al. ................... 361/714 |
| 7,679,285 | B2 | * | 3/2010 | Kim et al. ...................... 313/582 |
| 7,733,024 | B2 | * | 6/2010 | Woo et al. ...................... 313/582 |
| 7,799,428 | B2 | * | 9/2010 | Fujiwara et al. ............... 428/408 |
| 8,382,004 | B2 | * | 2/2013 | Asmussen et al. .............. 237/69 |
| 2002/0124932 | A1 | * | 9/2002 | Blain et al. ...................... 156/87 |
| 2002/0157819 | A1 | * | 10/2002 | Norley et al. .................. 165/185 |
| 2004/0000735 | A1 | * | 1/2004 | Gilbert et al. ................ 264/40.1 |
| 2004/0001317 | A1 | * | 1/2004 | Getz et al. ..................... 361/703 |
| 2005/0068738 | A1 | * | 3/2005 | Kim et al. ..................... 361/704 |
| 2005/0077000 | A1 | * | 4/2005 | Norley et al. .................. 156/249 |
| 2005/0111189 | A1 | * | 5/2005 | Smalc et al. ................... 361/700 |

FOREIGN PATENT DOCUMENTS

| | | | | | |
|---|---|---|---|---|---|
| GB | 2363120 | A | * | 12/2001 | ............... C08K 3/04 |
| GB | 2364820 | A | * | 2/2002 | ............... H01M 4/58 |
| GB | 2367291 | A | * | 4/2002 | ............... C01B 31/04 |

* cited by examiner

*Primary Examiner* — Adrian S Wilson

(57) ABSTRACT

An electronic device includes an electronic component with a mating surface. A thermal interface sheet is attached to the mating surface. A substrate carries the electronic device and includes a face. The electronic component is secured to the substrate with the thermal interface sheet positioned between the mating surface and the face. The mating surface is relatively less flat than the face and the mating surface is relatively smoother than the face.

16 Claims, 3 Drawing Sheets

METHOD OF MAKING AN ELECTRONIC DEVICE

PRIORITY CLAIM

This application claims priority to Provisional Patent Application No. 61/410,993 filed on Nov. 8, 2010, titled Method of Making an Electronic Device, the contents of which are hereby incorporated by reference in their entirety.

TECHNICAL FIELD

The invention relates to a method of making an electronic device and the device itself, more particular an electronic device in which an electronic component has a mating surface and the mating surface has a minimum amount of curvature.

BACKGROUND OF THE INVENTION

With the development of more and more sophisticated electronic components, relatively extreme temperatures can be generated. This is clearly true with respect to electronic components capable of increasing processing speeds and higher frequencies, having smaller size and more complicated power requirements, those generating additional lighting advancements or exhibiting other technological advances. These components include microprocessors and integrated circuits in electronic and electrical components and systems as well as in other devices such as high power optical devices. However, microprocessors, integrated circuits and other sophisticated electronic components typically operate efficiently only under a certain range of threshold temperatures. The excessive heat generated during operation of these components can not only harm their own performance, but can also degrade the performance and reliability of the overall system and can even cause system failure. The increasingly wide range of environmental conditions, including temperature extremes, in which electronic systems are expected to operate, exacerbates these negative effects.

With the increased need for heat dissipation from electronic devices caused by these conditions, thermal management becomes an increasingly important element of the design of electronic products. As noted, both performance reliability and life expectancy of electronic equipment are inversely related to the component temperature of the equipment. For instance, a reduction in the operating temperature of a device such as a typical silicon semiconductor can correspond to an exponential increase in the reliability and life expectancy of the device. Therefore, to maximize the lifespan and reliability of a component, controlling the device operating temperature within the limits set by the designers is of paramount importance.

One potential way to dissipate heat from an electronic component is by use of a flexible graphite thermal interface—that is, a thermal interface between the heat-generating component and another component such as a heat sink. Because of the anisotropic nature of flexible graphite sheet, it is uniquely effective at dissipating heat from a source, to effectively manage the heat generated in an electronic device or system. However, such a device prefers a low contact resistance between the various components of the system, such as the heat generating electronic component, the thermal interface material and the heat dissipating component.

Graphite is made of layer planes of hexagonal arrays or networks of carbon atoms. These layer planes of hexagonally arranged carbon atoms are substantially flat and are oriented or ordered so as to be substantially parallel and equidistant to one another. The substantially flat, parallel equidistant sheets or layers of carbon atoms, usually referred to as basal planes, are linked or bonded together and groups thereof are arranged in crystallites. Highly ordered graphite consist of crystallites of considerable size, the crystallites being highly aligned or oriented with respect to each other and having well ordered carbon layers. In other words, highly ordered graphite has a high degree of preferred crystallite orientation. Graphite possesses anisotropic structures and thus exhibit or possess many properties such as thermal conductivity that are highly directional.

Briefly, graphite may be characterized as laminated structures of carbon, that is, structures consisting of superposed layers or lamina of carbon atoms joined together by weak van der Waals forces. In considering the graphite structure, two sets of axes or directions are usually noted, to wit, the "c" axis or direction and the "a" axes or directions. For simplicity, the "c" axis or direction may be considered as the direction perpendicular to the carbon layers. The "a" axes or directions may be considered as the directions parallel to the carbon layers (parallel to the planar direction of the crystal structure of the graphite) or the directions perpendicular to the "c" direction.

As noted above, the bonding forces holding the parallel layers of carbon atoms together are only weak van der Waals forces. Graphite can be treated so that the spacing between the superposed carbon layers or lamina can be appreciably opened up so as to receive, or intercalate, other species between the carbon layers. Upon heating, the intercalated species decompose and volatilize to provide a marked expansion in the direction perpendicular to the layers, that is, in the "c" direction and thus form an expanded graphite structure (also referred to as exfoliated or intumesced graphite) in which the laminar character of the carbon layers is substantially retained.

Graphite flake which has been greatly expanded and more particularly expanded so as to have a final thickness or "c" direction dimension which is up to about 80 or more times the original "c" direction dimension can be formed without the use of a binder into cohesive or integrated articles and flexible graphite sheets of expanded graphite, e.g. webs, papers, strips, tapes, or the like. The formation of graphite particles which have been expanded to have a final thickness or "c" dimension which is up to about 80 or more times the original "c" direction dimension into integrated articles and flexible sheets by compression, without the use of any binding material, is believed to be possible due to the excellent mechanical interlocking, or cohesion, which is achieved between the voluminously expanded graphite particles.

In addition to flexibility, the graphite material, as noted above, also possess a high degree of anisotropy with respect to thermal conductivity, comparable to the graphite starting material due to orientation of the expanded graphite particles substantially parallel to the opposed faces of the sheet resulting from high compression, e.g. roll pressing. Sheet material thus produced has excellent flexibility, good strength and a very high degree of orientation.

Generally, the process of producing flexible, binder-less anisotropic graphite sheet material, e.g. web, paper, strip, tape, foil, mat, or the like, comprises compressing or compacting under a predetermined load and in the absence of a binder, expanded graphite particles which have a "c" direction dimension which is up to about 80 or more times that of the original particles so as to form a substantially flat, flexible, integrated graphite sheet. The expanded graphite particles that generally are worm-like or vermiform in appearance, once compressed, will maintain the compression set and alignment with the opposed major surfaces of the sheet. The density and thickness of the sheet material can be varied by controlling the degree of compression. The density of the sheet material can be within the range of from about 0.02 g/cc to about 2.0 g/cc. The flexible graphite sheet material exhibits an appreciable degree of anisotropy due to the alignment of graphite particles parallel to the major opposed, parallel surfaces of the sheet, with the degree of anisotropy increasing with the force imparted by roll pressing of the sheet material. In roll pressed anisotropic sheet material, the thickness, i.e. the direction perpendicular to the opposed, parallel sheet surfaces, comprises the "c" direction and the directions ranging along the length and width, i.e. along or parallel to the opposed, major surfaces, comprising the "a" directions and the properties of the sheet are very different, by more than an order of magnitude, for the "c" and "a" directions. For instance, the thermal conductivity of flexible graphite sheet varies significantly between the "c" and the "a" directions (i.e., about 2-40 watts per meter-° C. (W/m° C.) vs. about 150-600 W/m° C.).

In the manufacturing process the electronic device is typically built from its case up. In other words, the case is provided first, and then the heat dissipating material is secured to the case. Thereafter, an interface material is applied to a surface of the dissipating material and next the electronic device is applied to the interface material and secured to the dissipating component.

BRIEF DESCRIPTION

According to one aspect of the present invention, a method of making an electronic device is disclosed. The electronic device includes an electronic component having a mating surface, and a substrate having a face. A thermal interface sheet is provided and attached to the mating surface of the electronic component. The electronic component is secured to the substrate so that the thermal interface sheet is positioned between the mating surface and the face. The mating surface is relatively less flat and relatively smoother than the face of the substrate. Also disclosed herein is a device made in accordance with the above method.

According to another aspect of the present invention, an electronic device includes an electronic component having a mating surface. A thermal interface sheet is attached to the mating surface. A substrate includes a face, wherein the electronic component is secured to the substrate and the thermal interface sheet is positioned between the mating surface and the face. The mating surface is relatively less flat than the face and the mating surface is relatively smoother than the face.

DETAILED DESCRIPTION

Figure 1:
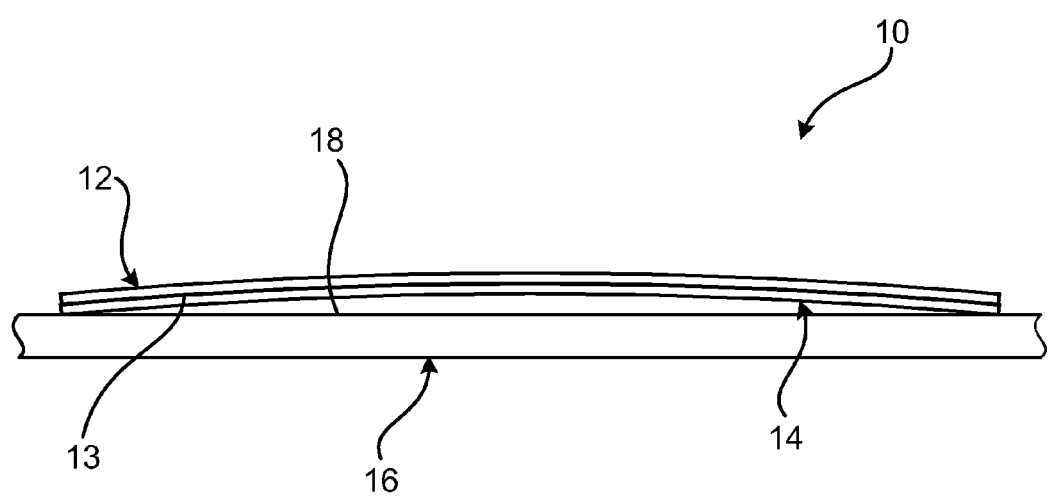
FIG. 1 is a schematic view of an embodiment disclosed herein.

With reference now to FIG. 1, an embodiment of the electronic device prepared in accordance with the present invention is shown and generally designated by the reference numeral 10. It should be noted that for the sake of clarity not all the components and elements of device 10 may be shown and/or marked in all the drawings. Also, as used in this description, the terms "up," "down," "top," "bottom," etc. refer to device 10 when in the orientation shown in FIG. 1. However, the skilled artisan will understand that device 10 can adopt any particular orientation when in use.

As shown in FIG. 1, device 10 includes a heat source in the form of an electronic component 12, a sheet of a compressed mass of exfoliated graphite particles 14, and a substrate 16.

Sheet 14 is intended to be used to facilitate the dissipation of heat from the heat source, more particularly from an electronic component 12. The electronic component 12 can comprise any electronic device or component that produces sufficient heat that it is desirable to dissipate the heat generated away from component 12. A non-limiting example of a reason to do so is so that the generated heat does not interfere with the operation of the electronic component or the system of which the electronic component is an element, if such heat was not dissipated. The electronic component 12 can comprise a microprocessor or computer chip, an integrated circuit, control electronics for an optical device like a laser or a field-effect transistor (FET), a printed circuit board (PCB), or components thereof, or other like electronic element. PCB is used herein to include traditional PCBs such as FR4 PCBs, metal core printed circuit boards ("MCPCB"), and insulated metal substrate printed circuit boards ("IMSPCB"). The electronic component includes at least one surface from which heat radiates and which can be used as a source of heat to be dissipated from the electronic component. In further examples, the PCB may further include one or more LEDs, OLEDs, or combinations thereof.

Electronic component 12 further includes a mating surface 13 on a bottom surface of component 12. As shown in FIG. 1, mating surface 13 may be adjacent to sheet 14. Mating surface 13 has a surface roughness and a flatness value. As shown in FIG. 1, mating surface 13 is not perfectly flat, particularly when component 12 is generating heat. The heat and or other forces may cause, for example, surface warping that may cause curvature or saddling or other variations in the flatness of mating surface 13. As shown in FIG. 1, (and exaggerated for demonstration purposes) surface 13 includes a curvature in a concave configuration. In other embodiments contemplated herein, surface 13 may have a different configuration, for example, only a portion of surface 13 may have a concave curvature, surface 13 may include a saddle point, or surface 13 may have a substantially corrugated configuration along a portion or all of surface 13.

The surface roughness and flatness of surface 13 may be measured in accordance with any number of techniques. Known techniques to measure surface roughness include micro-finish comparators for visual indicators, or by computer measurements such as by a Coordinate Measuring Machine ("CMM"). Techniques for measuring the surface flatness include physical measurement tools such as scales, calipers, or by CMM. In one or more embodiments, surface 13 has a sufficiently large degree of non-flatness that the attachment surface of sheet 14 becomes a factor in optimizing the dissipation of heat from component 12, preferably without the need for exertion of undesirably high amounts of pressure.

One principal function of sheet 14 is to form a sufficient operative connection with the mating surface 13 of the electronic component 12. Depending on the nature of the other constituents of a thermal management system employed, such as a heat sink or a heat pipe schematically shown as 16, a second function of sheet 14 may be to increase the effective surface area of the external surface of the electronic component 12, to facilitate additional heat dissipation therefrom.

To that end, sheet 14 may comprise an anisotropic flexible graphite sheet, such as HITHERM™ thermal interface materials available from GrafTech International Holdings Inc. An anisotropic flexible graphite sheet is a sheet of compressed, exfoliated graphite, especially natural graphite. Graphite is a crystalline form of carbon comprising atoms covalently bonded in flat layered planes with weaker bonds between the planes. By treating particles of graphite, such as natural graphite flake, with an intercalant of, e.g. a solution of sulfuric and nitric acid, the crystal structure of the graphite reacts to form a compound of graphite and the intercalant. The treated particles of graphite are hereafter referred to as "particles of intercalated graphite." Upon exposure to high temperature, the intercalant within the graphite decomposes and volatilizes, causing the particles of intercalated graphite to expand in dimension as much as about 80 or more times its original volume in an accordion-like fashion in the "c" direction, i.e. in the direction perpendicular to the crystalline planes of the graphite. The exfoliated graphite particles are vermiform in appearance, and are therefore commonly referred to as worms. The worms may be compressed together into flexible sheets that, unlike the original graphite flakes, can be formed and cut into various shapes.

Graphite starting materials suitable for use in the disclosed embodiment include highly graphitic carbonaceous materials capable of intercalating organic and inorganic acids as well as halogens and then expanding when exposed to heat. These highly graphitic carbonaceous materials most preferably have a degree of graphitization of about 1.0. As used in this disclosure, the term "degree of graphitization" refers to the value g according to the formula:

$$g = \frac{3.45 - d(002)}{0.095}$$

where d(002) is the spacing between the graphitic layers of the carbons in the crystal structure measured in Angstrom units. The spacing d between graphite layers is measured by standard X-ray diffraction techniques. The positions of diffraction peaks corresponding to the (002), (004) and (006) Miller Indices are measured, and standard least-squares techniques are employed to derive spacing which minimizes the total error for all of these peaks. Examples of highly graphitic carbonaceous materials include natural graphites from various sources, as well as other carbonaceous materials such as carbons prepared by chemical vapor deposition and the like. Natural graphite is most preferred.

A common method for manufacturing graphite sheet is described by Shane et al. in U.S. Pat. No. 3,404,061, the disclosure of which is incorporated herein by reference. In the typical practice of the Shane et al. method, natural graphite flakes are intercalated by dispersing the flakes in a solution containing e.g., a mixture of nitric and sulfuric acid, advantageously at a level of about 20 to about 300 parts by weight of intercalant solution per 100 parts by weight of graphite flakes (pph). The intercalation solution contains oxidizing and other intercalating agents known in the art. Examples include those containing oxidizing agents and oxidizing mixtures, such as solutions containing nitric acid, potassium chlorate, chromic acid, potassium permanganate, potassium chromate, potassium dichromate, perchloric acid, and the like, or mixtures, such as for example, concentrated nitric acid and chlorate, chromic acid and phosphoric acid, sulfuric acid and nitric acid, or mixtures of a strong organic acid, e.g. trifluoroacetic acid, and a strong oxidizing agent soluble in the organic acid. Alternatively, an electric potential can be used to bring about oxidation of the graphite. Chemical species that can be introduced into the graphite crystal using electrolytic oxidation include sulfuric acid as well as other acids.

The thus treated particles of graphite are sometimes referred to as "particles of intercalated graphite." Upon exposure to high temperature, e.g. temperatures of at least about 160° C. and especially about 700° C. to 1000° C. and higher, the particles of intercalated graphite expand as much as about 80 to 1000 or more times their original volume in an accordion-like fashion in the c-direction, i.e. in the direction perpendicular to the crystalline planes of the constituent graphite particles. The expanded, i.e. exfoliated, graphite particles are vermiform in appearance, and are therefore commonly referred to as worms. The worms may be compressed together into flexible sheets that, unlike the original graphite flakes, can be formed and cut into various shapes and provided with small transverse openings by deforming mechanical impact as hereinafter described.

The graphite sheet and foil are coherent, with good handling strength, and are suitably compressed, e.g. by roll-pressing, to a thickness of about 0.075 mm to 3.75 mm and a typical density of about 0.1 to 1.5 grams per cubic centimeter (g/cc).

The flexible graphite sheet can also, at times, be advantageously treated with resin and the absorbed resin, after curing, enhances the moisture resistance and handling strength, i.e. stiffness, of the flexible graphite sheet. Suitable resin content is at least about 5% preferably about 10 to 35% by weight, suitably up to about 60% by weight. Most preferably, however, the flexible graphite sheet has no ceramic particles contained therein, and is not treated with resin, in order to avoid dilution of the desired thermal characteristics of the sheet.

Once formed, the flexible graphite sheet can be cut into the desired shape to be used as sheet 14. When cut, sheet 14 has two major surfaces, as well as four edge surfaces if the thermal interface is rectangular in shape (as should be apparent, when sheet 14 is cut into other than rectangular shape, such as a round shape or a more complex shape, it will have different numbers of edge surfaces).

Sheet 14 may also comprise a protective coating on one or both major surfaces, to forestall the possibility of graphite particles flaking from, or otherwise being separated from the sheet. Protective coating may also advantageously effectively electrically isolate sheet 14 if such is desired, to avoid electrical interference engendered by the inclusion of an electrically conductive material (graphite) in an electric device. The protective coating can comprise any suitable material sufficient to prevent the flaking of the graphite material and/or to electrically isolate the graphite, such as a thermoplastic material like polyethylene, a polyester or a polyimide.

Advantageously, the protective coating is applied in a layer thin enough to avoid degrading the heat dissipation function of sheet 14. In other words, since protective coating is formed of a material that does not have the thermal dissipation characteristics of flexible graphite, the protective coating is applied such that it is not so thick as to interfere substantially with the heat dissipation afforded by sheet 14. To that end, in certain embodiments the protective coating should be no more than about 0.025 millimeters thick, preferably no more than about 0.005 millimeters thick. Although there is no true minimum thickness for the protective coating, to achieve the desired flake-resistance and/or electrical isolation, the protective coating should preferably be at least about 0.001 millimeters thick.

In one particular embodiment, a major surface of sheet 14 has a surface area that is equal to the surface area of mating surface 13, and such major surface is adhered to surface 13. In an alternate embodiment, sheet 14 has a major surface that has a surface area that is substantially no more than the surface area of mating surface 13, this major surface is adjacent surface 13 in device 10.

In various embodiments, protective coating can be applied to sheet 14 so as to cover only one major surface of sheet 14 or the major surface and one or more edge surfaces of sheet 14 (depending, for instance, on which are exposed and thus subject to flaking and/or electrical interference). The protective coating can be applied, for example, by mechanical mapping and lamination.

Generally, the coating process adheres protective coating to sheet 14 with sufficient strength for most applications. However, if desired, or for relatively non-adhesive protective coatings, such as Mylar® polyester materials and Kapton polyimide materials (both commercially available from E.I. du Pont de Nemours and Company of Wilmington, Del.), a layer of adhesive may be applied between sheet 14 and the protective coating, Advantageously, the layer of adhesive is as thin as possible while still maintaining adhesion between the protective coating and sheet 14. In an embodiment, preferably, the layer of adhesive is no more than about 0.015 millimeters.

In an alternate embodiment sheet 14 may be constructed from graphitized polyimide sheet instead of a compressed mass of exfoliated graphite particles. Examples of such material include SS1500 Spreadershield™ heat spreaders available from GrafTech International Holdings Inc.

As shown in FIG. 1, device 10 further includes a substrate 16 which component 12 is secured to. In one embodiment substrate 16 functions as a heat dissipating component, e.g. a heat spreader, a heat sink, or a heat pipe. In a particular embodiment, substrate 16 may be the case or housing of device 10. Substrate 16 has a face 18 which component 12 is attached to. Face 18 has a surface roughness and a flatness value.

In the preferred embodiments disclosed herein, the flatness value of the mating surface 13 and face 18 may be defined as the distance between the minimum and maximum peaks of a curve-fit of a cross-sectional profile of mating surface 13 and face 18. The curve-fit is of the largest curve, saddle or warped cross-section of the respective surface. In other embodiments, the flatness value of mating surface 13 and face 18 are determined by calculating the average vertical change per unit of measured length along the curve-fit (e.g. millimeter's vertical change per millimeter lateral distance). For the purposes of this disclosure, unless otherwise indicated, the flatness value represents the distance between minimum and maximum peaks of a curve-fit of a cross-sectional profile of mating surface. In one embodiment, the flatness value is measured with no heat generated by or transmitted through component 12 (i.e. the component is at approximately room temperature). In other embodiments, the flatness value is measured with heat being generated by or transmitted through component 12 (i.e. the component temperature is elevated from room temperature).

In one or more embodiments, the flatness value of the mating surface 13 of component 12 is greater than the flatness value of the face 18 of substrate 16. In other words, the face 18 is relatively more flat than the mating surface 13. In particular, because of the heat, forces and/or manufacturing defects of component 12 tend to cause relatively more surface warping, curvature and saddling as compared to substrate 16.

In the preferred embodiments disclosed herein, the surface roughness of mating surface 13 and face 18 is measured as the root-mean-square of the vertical displacement measurements in a measured area. In one or more embodiments the surface roughness of the mating surface 13 is less than the surface roughness of face 18 of substrate 16. In other words, the mating surface 13 is smoother than face 18.

Sheet 14 is preferably adhered to the surface having a relatively larger flatness value (i.e. the relatively less flat element). Thus, sheet 14 is preferably adhered to mating surface 13. In one embodiment, an adhesive is applied to a major surface of sheet 14, and the major surface of sheet 14 having the adhesive applied to it is attached to mating surface 13 of component 12. In a second embodiment, an adhesive is applied to mating surface 13 of component 12 and a major surface of sheet 14 is applied to the adhesive coated mating surface 13.

As should be appreciated by one skilled in the art, sheet 14 is commonly adhered to the element in a system having the largest surface roughness. However, according to the present invention, the sheet 14 is adhered to the element having the largest flatness value and the relatively lower surface roughness. In other words, the sheet 14 is attached to the relatively smoother element.

In certain embodiments, the flatness value of surface 13, when measured in the same units, is greater than the surface roughness of face 18. In a further embodiment, the flatness value of surface 13, when measured in the same units, is at least about 15% greater than the surface roughness of face 18. In a further embodiment, the flatness value of surface 13, when measured in the same units, is at least about 20% greater than the surface roughness of face 18. In a further embodiment, the flatness value of surface 13, when measured in the same units, is at least about 25% greater than the surface roughness of face 18.

Example 1

The relationship between flatness values and surface roughness and thermal resistance was studied using a TO220 n MOSFET PCB and a T3Ster interface. The PCB was secured to a substrate using four #6-32 UNC screws and a GrafTech HiTherm 1210A compressed expanded natural graphite sheet was positioned between the PCB and casting. The flatness value of the PCB was determined to be higher (i.e. less flat) than the flatness value of the substrate. The surface roughness of the PCB was determined to be less than (i.e. smoother) the surface roughness of the substrate. The surface roughness of the PCB was less than 10 μm and the substrate was approximately 35 μm. Three configurations were tested: (1) the HiTherm 1210A was adhered to the substrate; (2) the HiTherm 1210A was adhered to the PCB; (3) no adhesive.

Figure 2:
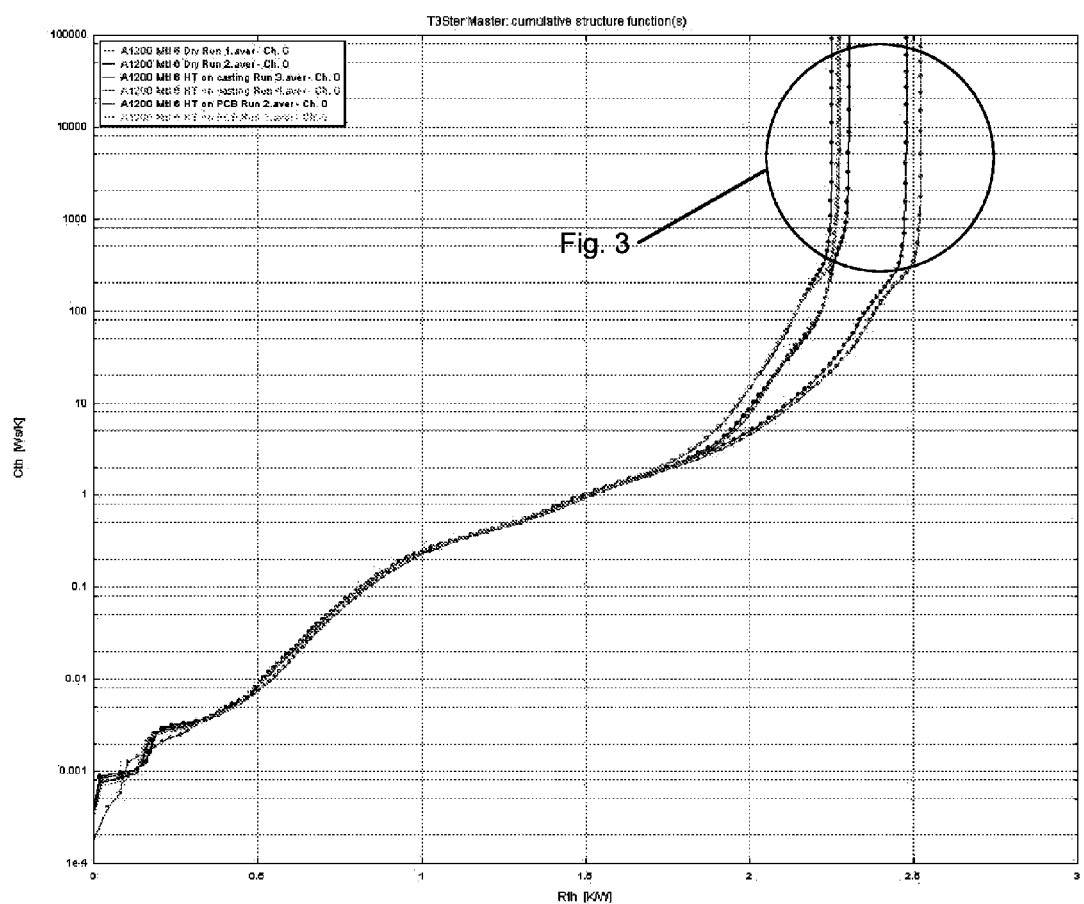
FIG. 2 is a plot of transient heat transfer response for Example 1.
Figure 3:
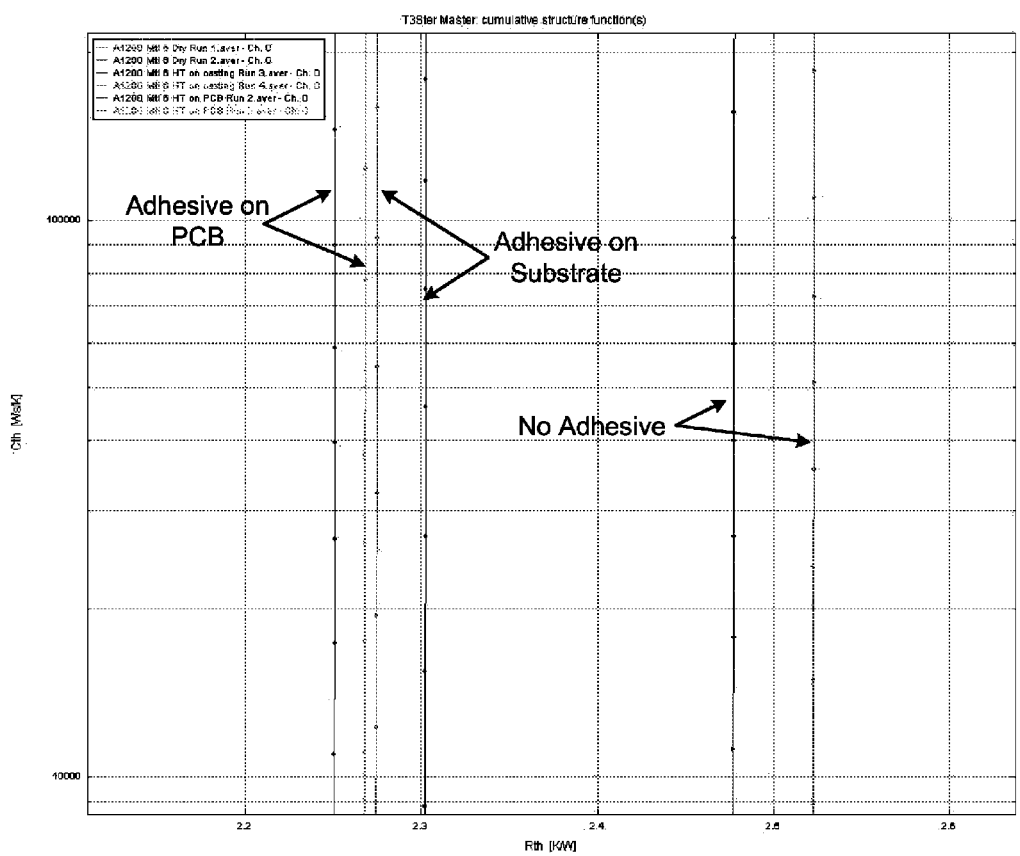
FIG. 3 is an enlarged view of the circled region of the plot of FIG. 2.

With reference now to FIGS. 2 and 3, it can be seen that the thermal resistance at 100,000 Ws/K is approximately 2.25 C/W for configuration (2); 2.3 C/W for configuration (1); and 2.5 C/W for configuration (3). Thus, the configuration wherein the HiTherm sheet is adhered to the PCB exhibited the lowest thermal resistance.

The above description is intended to enable the person skilled in the art to practice the invention. It is not intended to detail all of the possible variations and modifications that will become apparent to the skilled worker upon reading the description. It is intended, however, that all such modifications and variations be included within the scope of the invention that is defined by the following claims. The claims are intended to cover the indicated elements and steps in any arrangement or sequence that is effective to meet the objectives intended for the invention, unless the context specifically indicates the contrary.

What is claimed is:

1. An electronic device comprising:
an electronic component having a mating surface;
a thermal interface sheet attached to the mating surface;
a substrate having a face, the electronic component secured to said substrate and said thermal interface sheet positioned between said mating surface and said face; and
wherein the mating surface has a flatness value and the face has a surface roughness, the mating surface flatness value at least about 15% greater than the face surface roughness when measured in the same units.

2. The method of claim 1 wherein the mating surface has a concave configuration.

3. The method of claim 1 wherein the mating surface has a saddle point configuration.

4. The method of claim 1 wherein the mating surface has a generally corrugated configuration.

5. The method of claim 1 wherein an adhesive attaches the thermal interface sheet to the mating surface.

6. The method of claim 1 wherein the mating surface flatness value at least about 20% greater than the face surface roughness when measured in the same units.

7. The method of claim 1 wherein a surface area of a major surface of the thermal interface sheet not larger than about the surface of the face of the substrate.

8. The method of claim 1 wherein the electronic component comprises a PCB having an LED or an OLED.

9. The method of claim 1 wherein said thermal interface sheet comprises a compressed mass of exfoliated graphite particles.

10. The method of claim 1 wherein said thermal interface sheet comprises a graphitized polyimide sheet.

11. The method of claim 5 wherein said adhesive comprises a layer no more than about 0.0015 mm thick.

12. The method of claim 1 further including a protective coating adjacent to said thermal interface sheet.

13. The method of claim 12 wherein said protective coating not more than about 0.025 mm thick.

14. The method of claim 13 wherein said protective coating not more than about 0.005 mm thick.

15. The method of claim 1 wherein said substrate comprises a heat dissipating device.

16. The method of claim 1 wherein said substrate substantially surrounds said device.

* * * * *